(12) United States Patent
Shmuel

(10) Patent No.: US 12,445,137 B2
(45) Date of Patent: Oct. 14, 2025

(54) LOW NOISE, SUPPLY REJECTING LINEAR PHASE INTERPOLATOR

(71) Applicant: Apple Inc., Cupertino, CA (US)

(72) Inventor: Kobie Shmuel, Herzliya (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/507,051

(22) Filed: Nov. 12, 2023

(65) Prior Publication Data

US 2025/0062769 A1    Feb. 20, 2025

Related U.S. Application Data

(60) Provisional application No. 63/520,627, filed on Aug. 20, 2023.

(51) Int. Cl.
*H03L 7/099* (2006.01)
*H03L 7/081* (2006.01)
*H03L 7/093* (2006.01)

(52) U.S. Cl.
CPC .......... *H03L 7/0998* (2013.01); *H03L 7/0818* (2013.01); *H03L 7/093* (2013.01)

(58) Field of Classification Search
CPC ......... H03K 5/135; H03K 2005/00058; H03K 2005/00286; H03L 7/0998
See application file for complete search history.

(56) References Cited

U.S. PATENT DOCUMENTS

| 6,111,445 A | 8/2000 | Zerbe et al. |
| 8,384,464 B1 | 2/2013 | Shah |
| 9,705,668 B2 | 7/2017 | Huang |
| 2007/0146014 A1* | 6/2007 | Cheung ................... H03L 7/091 327/20 |
| 2009/0251189 A1 | 10/2009 | Hsieh |

(Continued)

OTHER PUBLICATIONS

Behzad Razavi, The Design of a Phase Interpolator, IEEE Solid-State Circuits Magazine (vol. 15, Issue: 4, Fall 2023), Nov. 16, 2023 (Year: 2023).*

(Continued)

*Primary Examiner* — Aristocratis Fotakis
(74) *Attorney, Agent, or Firm* — Meitar Patents Ltd.; Daniel Kligler

(57) ABSTRACT

A phase interpolator circuit includes a capacitance circuit, a switched resistor network, and interpolation management circuitry. The resistor network receives a start-phase signal and an end-phase signal, and generates an interpolated output signal from a voltage on the capacitance circuit. The interpolation management circuitry receives an interpolation code defining an intermediate phase between the start-phase signal and the end-phase signal, charges or discharges the capacitance circuit through the resistor network, and controls the resistor network to set a phase of the interpolated output signal to be the intermediate phase. The interpolation management circuitry also (i) responsively to a transition in the start-phase signal, sets the resistance of the resistor network based on the interpolation code, and (ii) responsively to a voltage level on the capacitance circuit, sets the resistance of the resistor network to a constant resistance, and flows through the capacitance circuit an additional boosting current.

20 Claims, 11 Drawing Sheets

(56) References Cited

U.S. PATENT DOCUMENTS

| | | |
|---|---|---|
| 2016/0352506 A1 | 12/2016 | Huang |
| 2019/0296748 A1* | 9/2019 | Jakobsson ............. H03L 7/0814 |
| 2021/0044300 A1* | 2/2021 | Haroun ................... H03L 7/16 |
| 2024/0364493 A1* | 10/2024 | Rao ....................... H04L 7/0025 |

OTHER PUBLICATIONS

Jakobsson et al., "A Low-Noise RC-Based Phase Interpolator in 16-nm CMOS," IEEE Transactions on Circuits and Systems II: Express Briefs, vol. 66, issue 1, pp. 1-5, Jan. 2019.

Pagiamtzis, "ECE1352 Analog Integrated Circuits—Reading Assignment: Phase Interpolating Circuits," University of Toronto, pp. 1-21, Nov. 12, 2001.

Tsimpos et al., "All Digital Phase Interpolator," Conference Paper, 10th International Conference on Design & Technology of Integrated Systems in Nanoscale Era (DTIS), IEEE, pp. 1-6, year 2015.

Aytur et al., "Phase Interpolator", The Berkeley Intelligent RAM (IRAM) Project, CS 254 Project Report, pages Chapter 2.2, 1-5, Aug. 12, 1997, as downloaded from http://iram.cs.berkeley.edu/serialio/cs254/interpolator/interp.html.

Wikipedia, "Internet of Things," pp. 1-53, last updated Jul. 31, 2023.

\* cited by examiner

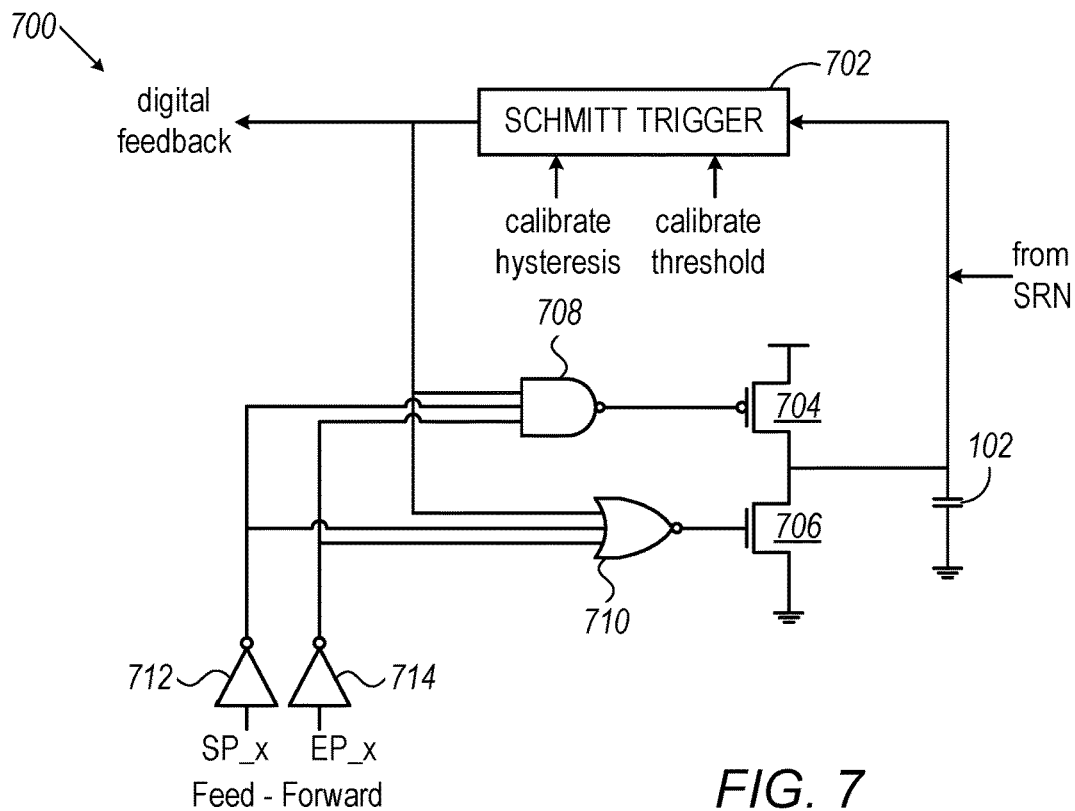
FIG. 7
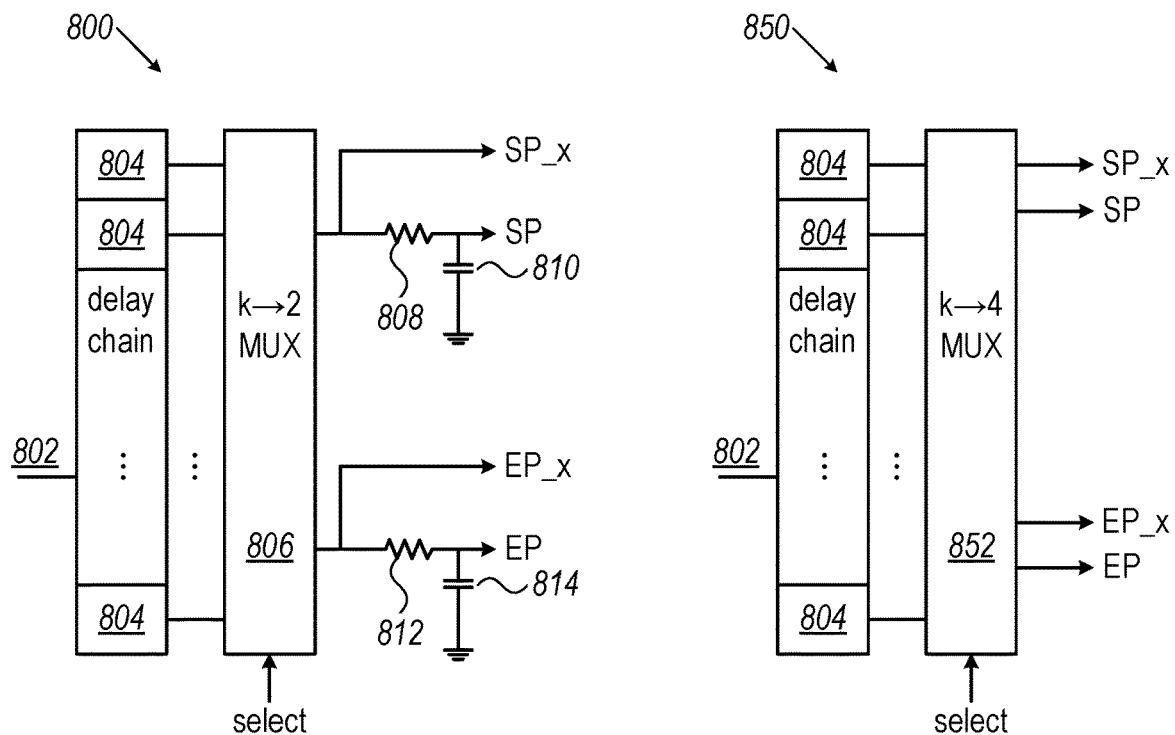
FIG. 8A
FIG. 8B

LOW NOISE, SUPPLY REJECTING LINEAR PHASE INTERPOLATOR

CROSS-REFERENCE TO RELATED APPLICATIONS

This application claims the benefit of U.S. Provisional Patent Application 63/520,627, filed Aug. 20, 2023, whose disclosure is incorporated herein by reference.

FIELD OF THE DISCLOSURE

The present disclosure relates generally to integrated circuits, and specifically to phase interpolation circuits.

BACKGROUND OF THE DISCLOSURE

Phase interpolation circuits are used, for example, to calibrate delays in integrated circuits (ICs). Phase interpolators are commonly used in clock-data-recovery (CDR) circuits for high-speed data transmission systems, and in forward clock applications, which typically require control over clock and data skew. A phase interpolator may be used in a CDR circuit to generate a phase-shifted version of the recovered clock signal, which is then used to align the data with the recovered clock.

In non-optimal working conditions, a phase interpolator may distort the output signal, degrading performance of a circuit reliant on the phase interpolator to adjust a clock signal. A potential source for such distortions is noise in the power supply of the phase interpolator, which results in sampling jitter.

One way to mitigate the power supply noise is to use a Low Dropout (LDO) power supply regulator, which provides the phase interpolator with a reduced noise (and reduced voltage) supply. Such a solution, however, reduces the power efficiency of the circuit.

SUMMARY OF THE DISCLOSURE

An embodiment that is described herein provides a phase interpolator circuit including a capacitance circuit, a switched resistor network having a configurable resistance, and interpolation management circuitry. The switched resistor network is configured to receive a start-phase reference signal and an end-phase reference signal that is delayed relative to the start-phase reference signal, and to generate an interpolated output signal from a voltage on the capacitance circuit. The interpolation management circuitry is configured to receive an interpolation code that defines an intermediate phase between the start-phase reference signal and the end-phase reference signal, to charge or discharge the capacitance circuit through the switched resistor network, and to control the switched resistor network to set a phase of the interpolated output signal to be the intermediate phase defined by interpolation code. The interpolation management circuitry is further configured to (i) responsively to a transition in the start-phase reference signal, set the resistance of the switched resistor network based on the interpolation code, and (ii) responsively to a voltage level on the capacitance circuit, set the resistance of the switched resistor network to a constant resistance that is independent of the interpolation code, and flow through the capacitance circuit an additional boosting current that accelerates charging or discharging of the capacitance circuit.

BRIEF DESCRIPTION OF THE DRAWINGS

FIG. 7 is a block diagram that schematically illustrates a Stage-3 Timing Circuit, in accordance with an embodiment that is described herein.

FIG. 8A is a block diagram that schematically illustrates a Reference Phase Generator, in accordance with a first example embodiment that is disclosed herein.

FIG. 8B is a block diagram that schematically illustrates a Reference Phase Generator, in accordance with a second example embodiment that is disclosed herein.

DETAILED DESCRIPTION OF EMBODIMENTS

Overview

Figure 1:
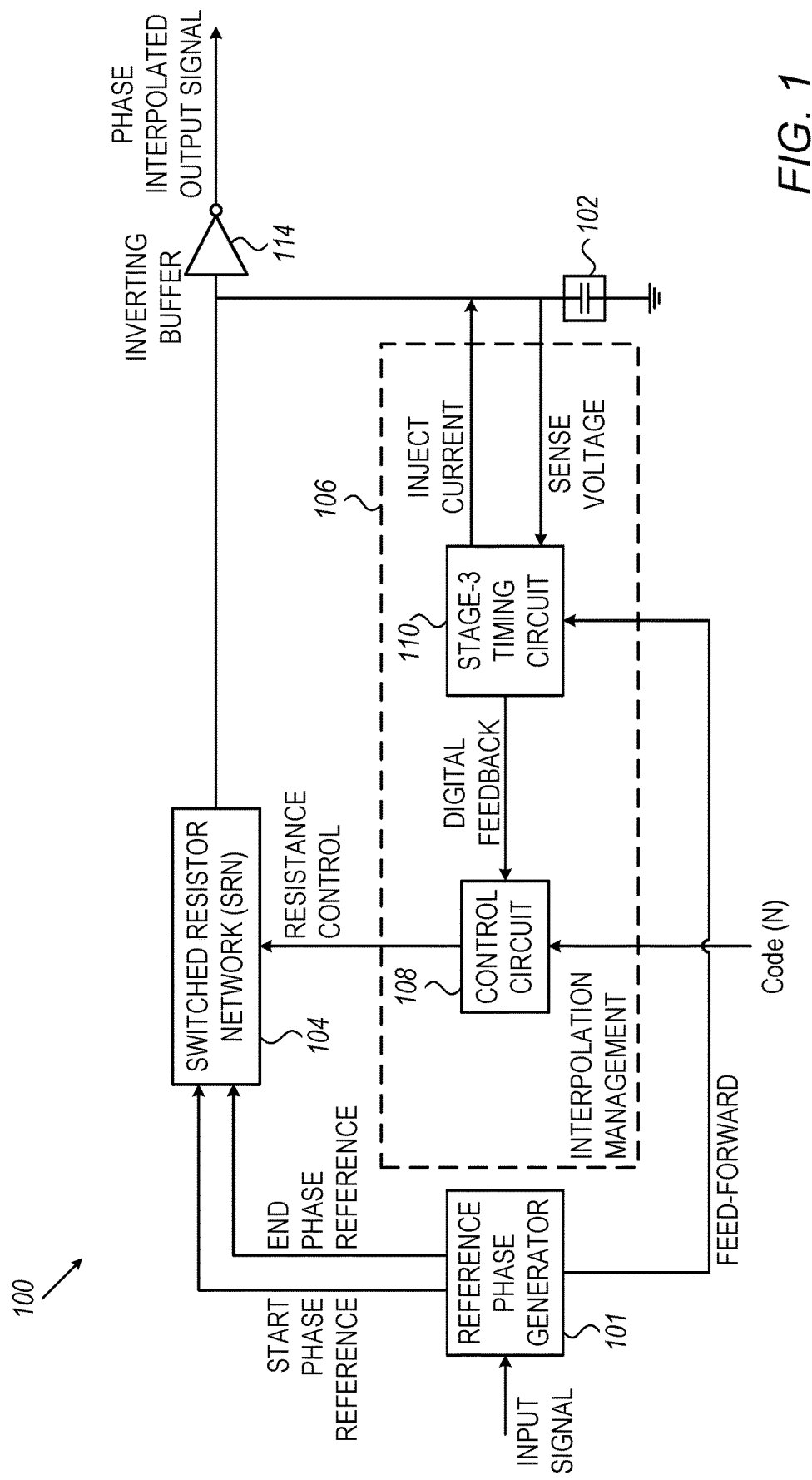
FIG. 1 is a block diagram that schematically illustrates a Phase Interpolator, in accordance with an embodiment that is described herein.

Embodiments that are disclosed herein provide for phase interpolation circuits and methods with enhanced immunity to power supply noise, without having to regulate the power supply input. In an embodiment, the phase interpolator receives an input signal and a delay code, and outputs a delayed version of the input signal, wherein the delay is determined responsively to the code. In some embodiments, the delay code may assume any value from 0 to a maximal value; the delay value is designated N hereinbelow.

In some embodiments, the phase interpolator comprises a reference phase generator, which is configured to generate a start-phase reference signal and an end-phase reference signal, both being delayed versions of the input signal. In other embodiments, the phase interpolator does not comprise a reference phase generator, and, instead, the start and end phase signals are input to the phase interpolator.

The start-phase and end-phase reference signals are used as reference to the phase delay of the interpolated output signal, wherein the difference between the delay associated with the minimal code value (0) and the delay associated with the maximal delay value (N) is equal to the phase delay between the start-phase and the end-phase signals, and, wherein, the difference between the delay associated with any other code value and the delay associated with a zero code value will be proportional to the code.

In some embodiments, the phase interpolator comprises a switched resistor network (SRN) that charges or discharges a capacitance circuit. In some embodiments, the phase interpolator charges or discharges capacitance circuit responsively to an edge in the input signal. The SRN comprises relatively large passive resistors that have a power-supply independent resistance the (unlike resistance of the active switches that are coupled to the resistors), which mitigate the power-supply induced jitter (PSIJ).

Benefits stemming from the use of large resistance values in the SRN include improved supply noise rejection, and low resistance mismatch. However, large resistance values may considerably limit the input signal bandwidth.

To improve the bandwidth without losing the benefits associated with large resistance values, a multi-stage charge/discharge operation is used, controlled by a dedicated timing circuit.

In embodiments, the charge or discharge process is divided into three stages-a first stage, in which the rate of charge/discharge is proportional to the interpolation code; a second stage, in which the charge/discharge rate is independent of the interpolation code; and a third stage, in which additional boost current is added to the charge or discharge current, to quickly reach the power rail voltage of the capacitor ("regeneration").

In an embodiment, the first stage takes place between the leading edge of the start-phase signal and the leading edge of the end-phase signal; the second stage is from the leading edge of the end-phase signal and until the third stage begins, and the third stage starts when the voltage on the integration capacitor reaches a preset threshold.

In some embodiments, the phase reference generator is configured to output, shortly before the trailing edge of the end-phase signal, a feed-forward signal, which stops the additional boost current.

Thus, in embodiments, the phase interpolator is highly resilient to supply voltage noise, and yet does not incorporate high power consumption linear supply voltage regulators.

The embodiments disclosed below further describe embodiments comprising i) a power-supply-noise resilient capacitance circuit; ii) two reference phase generator circuits; iii) a single-slope phase interpolator; iv) a duty-cycle correction phase interpolator. Lastly, an embodiment comprising a hierarchical phase-interpolation circuit is described.

DESCRIPTION OF EMBODIMENTS

Phase interpolators should ideally generate an output signal that is a delayed version of an input signal. The delay is set responsively to a thermometer-code input, wherein a value of zero sets the delay to a minimum delay value, and each delay unit adds a fixed increment to the delay. In embodiments, a disclosed phase interpolator comprises a phase reference generator that is configured to generate a start-phase reference signal that is a delayed version of the input clock, and a stop-phase reference signal that is a delayed version of the start-phase reference signal. The delay between the end-phase and the start-phase signals is ideally equal to the difference between the delay of the output signal when the code is at maximum value and the delay of the output signal when the code is 0.

Mathematically, for an ideal interpolator:
Start-phase signal: $V(t)$
End-phase signal: $V(t-D)$
Output signal: $V(t-D*(code/max\_code)-T0)$
Where T0 is the insertion delay, set by a tuned capacitor.

Practically, as will be described below, disclosed phase interpolators delay rail-to-rail signals such as clock and data, by delaying the rising and falling edges of the start-phase signal.

FIG. 1 is a block diagram that schematically illustrates a Phase Interpolator 100, in accordance with an embodiment that is described herein. The phase interpolator comprises a reference-phase generator 101, which is configured to receive an input signal and to generate (i) a start-phase reference signal that is a delayed version of the input signal, and (ii) an end-phase reference signal that is a delayed version of the start-phase reference signal. In embodiments the delay between the start-phase and the end-phase signals may be preset. The phase interpolator further receives a thermometer interpolation code input (N), and outputs a phase-interpolated signal. In some embodiments, phase interpolator 100 receives a thermometer interpolation code input at a control circuit 108, as will be described below. In some embodiments, phase interpolator 100 is preset with a value for the thermometer interpolation code input.

Phase interpolator 100 further comprises a capacitance circuit 102, which is charged or discharged through a switched resistor network (SRN) 104, and an interpolation management circuit 106. In an embodiment, capacitance circuit 102 comprises one or more capacitors; in some embodiments the capacitance of the capacitance circuit 102 can be trimmed (an example embodiment of a capacitance circuit will be described below, with reference to FIG. 3).

In embodiments, the SRN 104 is configured to connect a set of resistors to charge or discharge the capacitance circuit 102. In some embodiments, SRN 104 connects or disconnects the set of resistors responsively to a resistance control indication that the SRN 104 receives from the interpolation management circuit 106, and to the Start and End Phase inputs (generated by Reference Phase Generator 101). In some embodiments, interpolation management circuit 106 includes SRN 104, in which case SRN 104 receives the resistance control indication from a component of interpolation management circuit 106, such as control circuit 108.

In an embodiment, one or more resistors of SRN 104 may be trimmed during manufacturing, to improve resistance accuracy and resistor matching. In embodiments, SRN 104 comprises passive resistors (e.g., diffusion or polysilicon resistors), which are insensitive to power supply variations and resilient to power supply noise.

In embodiments, the capacitance circuit 120 is discharged responsively to a rising edge of the input signal, and charged responsively to a falling edge of the input signal. The polarity of the edges of the capacitor voltage may then be inverted relative to the polarity of the edge in the input signal. The phase interpolator 100 further comprises an inverting buffer 114, to align the edge polarity of the output signal to the edge polarity of the input signal.

In some embodiments, the edges (rising and falling) of the output signal are divided to three stages. The first is an initial stage, wherein the SRN 104 charges or discharges capacitance circuit 102 through a code-dependent resistance. The second is an intermediate stage, wherein the resistance is fixed. The third is a final stage wherein the resistance through the resistor network is fixed, but the interpolation management circuit 106 charges (or discharges) the capacitor through a parallel path, thereby increasing the charge/discharge rate. In some embodiments, the resistance also changes responsively to the polarity of the input signal edge.

In embodiments, the initial stage and the intermediate stage are determined responsively to the start-phase and end-phase signals, whereas the final stage is determined responsively to the voltage level on the capacitor. In alternative embodiments, the start and/or end of the initial, intermediate and/or final stage can be triggered by any other suitable event or condition.

Interpolation management circuit comprises a control circuit 108 and a stage-3 timing circuit 110. The control circuit is configured to set the resistance control indication responsively to the N code, to the start-phase signal, to the end-phase signal, and to digital feedback that the intra-phase timing circuit outputs. The control circuit is further configured to detect rising and falling edges of digital feedback signal (from stage-3 timing circuit 110) and modify the direction of the next interpolation (pull up or pull down) accordingly.

Stage-3 timing circuit 110 is configured to compare the voltage on the capacitor to a preset threshold. For a rising edge input signal, stage 3 is set when the voltage on the capacitor exceeds the threshold voltage, and for a falling edge input signal, stage 3 is set when the capacitor voltage is below the threshold. The timing circuit also indicates to the control circuit, via digital feedback, that stage 3 is on.

When stage 3 is on, Stage-3 timing circuit 100 boosts the capacitor charging rate by providing additional charge current (or, for a falling-edge of the input signal, by additional providing discharge current). In some embodiments, to quickly stop the boosting current in time (so that response to the next edge will not be delayed), the Stage-3 timing circuit receives a feed-forward indication from reference phase generator 101.

In some embodiments, the phase interpolator does not comprise a reference phase generator. Instead, the start-phase and the end-phase (and, in embodiments, the feed-forward) signals are input to the phase interpolator, for example, by an external delay line.

The configuration of phase interpolator 100, illustrated in FIG. 1 and described hereinabove is an example configuration that is cited merely for the sake of conceptual clarity. Other configurations may be used in alternative embodiments. For example, in some embodiments, control circuit 108 comprises the reference phase generator 101, and signals feed-forward to the stage-3 timing circuit. In embodiments, the SRN may comprise various configurations of switched resistors, e.g., an R-2R ladder, wherein the equivalent resistance is set responsively to the N code.

Some embodiments may include the use of biased switched current mirror, or a calibrated up/down charge pump for output regeneration function, providing improved timing control. In embodiments, sensing threshold on a replica may also be used, and/or sensing the phase interpolator receiver output rather than direct sensing of the interpolation node.

Symmetry of the Start-Phase and End-Phase Signals

As explained above, phase interpolator 100 produces an interpolated output signal whose phase refers to the phase difference between the start-phase and the end-phase signals. In an embodiment, the phase interpolator is symmetric with respect to the start-phase and end-phase signals, and, thus, the leading phase input signal can be wired to the end-phase input, and the trailing phase input signal can be wired to the start-phase input. In other words, the start-phase and the end-phase inputs of the interpolation circuitry can be interchanged (although calibration should be done according to the actual wiring).

The interchangeability of the phase signals makes the phase interpolator agnostic to the time relationship between its inputs and makes the phase interpolator's response causal. This, in turn, adds flexibility and simplifies the design of the interpolator driver (e.g., the phase generator).

Determining the Charge/Discharge Stage

In embodiments, the capacitor charge stage is determined as follows:

Stage 1, in which the SRN charges the capacitor at a rate according to the code N, starts with the falling of the start-phase input signal and ends with the falling edge of the end-phase input signal.

Stage 2, in which the SRN charges the capacitor at a rate independent of N, starts with the falling edge of the end-phase, and ends when stage 3 begins.

Stage 3, in which the SRN continues to charge the capacitor at a rate that is independent of N and, in addition the stage-3 timing circuit increases the charge rate by providing an additional boost current to the capacitor, starts when the voltage on the capacitor exceeds a preset threshold and ends at a preset delay following the rising edge of the end-phase signal.

The capacitor discharge stages are determined in a similar manner, with rising edges rather than falling edges, and with discharge instead of charge.

Figure 2:
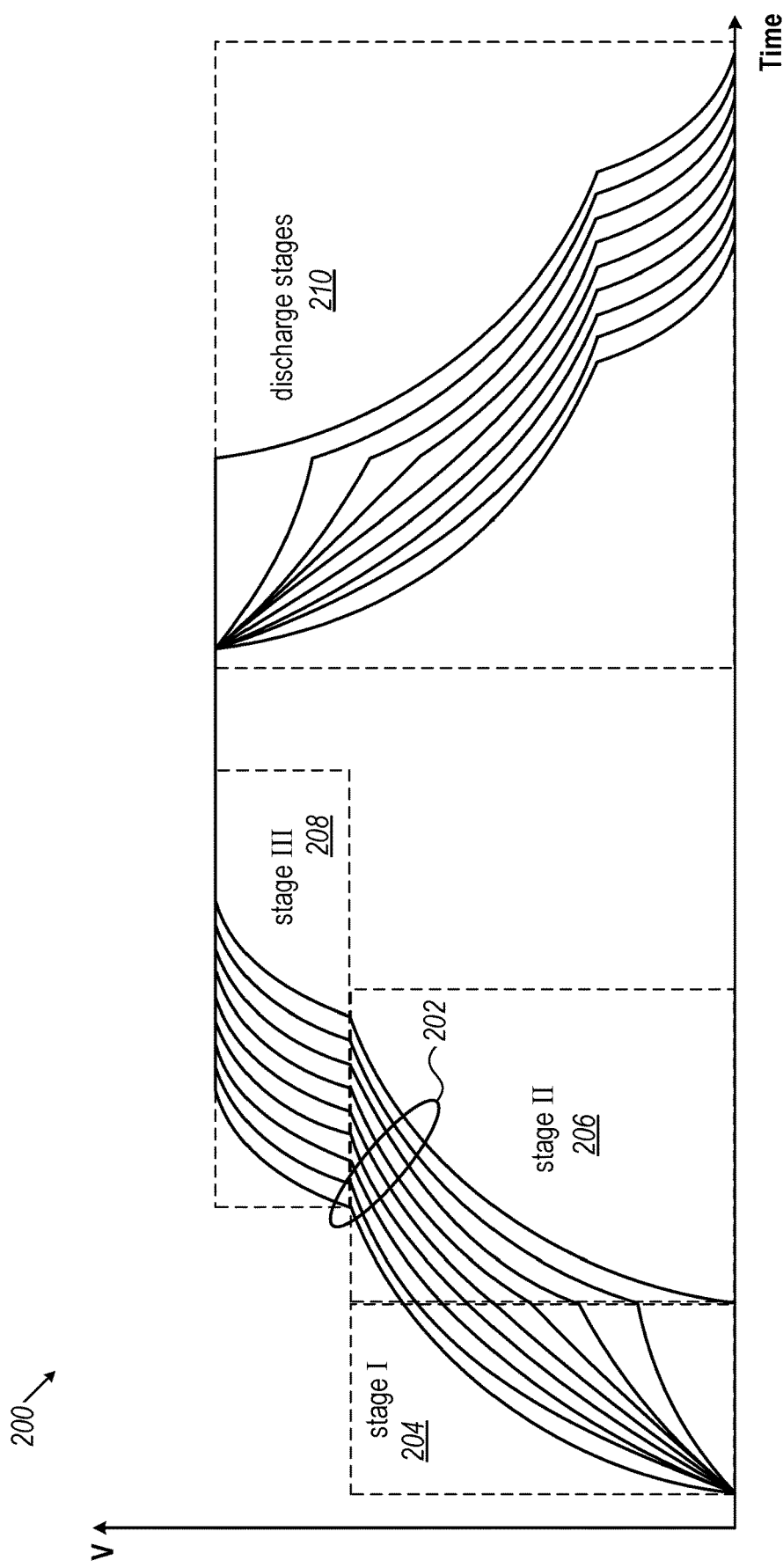
FIG. 2 is a timing diagram that schematically illustrates the rising and falling edge waveforms of a capacitor voltage in a phase interpolator, in accordance with an embodiment that is described herein.

FIG. 2 is a timing diagram 200 that schematically illustrates the rising and falling edge waveforms of the capacitor voltage, in accordance with an embodiment that is described herein. Curves 202 illustrate the timing waveforms for nine different settings of N (from 0 to 8). In a first charge stage 204, SRN 104 charges capacitance circuit 102 (both shown in FIG. 1) according to the N code; the voltage increase rate grows from right to left, from the slowest right-most curve to the fastest left-most curve.

At a second charge state 206 (stage 2), the SRN charges the capacitor through a code-independent resistance, and curves 202 are parallel to each other.

At the third charge stage 208, the resistor network still charges the capacitor through a code-independent resistance, but now, the stage-3 timing circuit (110, FIG. 1) provides additional charge current; curves 202 are still parallel to each other for all input codes, as at this stage the SRN configuration is the same for all input codes, but the rise time sharply increases. After stage 3, the phase interpolator is ready to discharge the capacitor, responsively to a rising edge of the input signal.

Lastly, at Discharge stages 210, the input signals Start-Phase and End-Phase transition from low to high, curves 210 indicates the discharging of the capacitor, which, like the charging stages, go through a code-dependent stage, a code-independent stage, and code-independent-with-boost-current stage.

Figure 3:
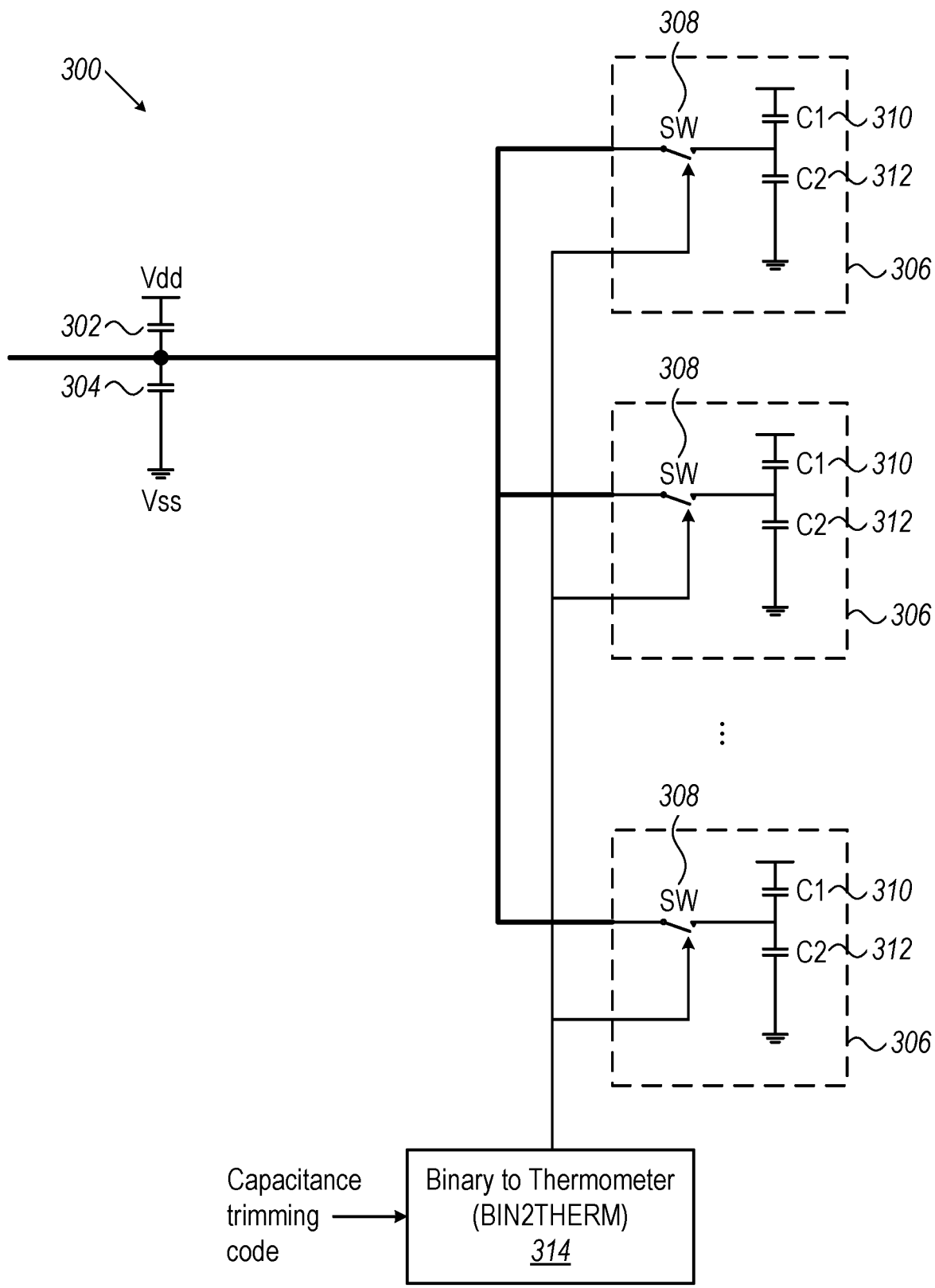
FIG. 3 is a circuit diagram that schematically illustrates a Capacitance Circuit coupled between an input and supply terminals in a phase interpolator, in accordance with an embodiment that is described herein.

FIG. 3 is a circuit diagram that schematically illustrates a Capacitance Circuit 300 coupled between an input and the supply terminals in a phase interpolator, in accordance with an embodiment that is described herein. The capacitance circuit is configured to provide trimmable, supply-noise resilient capacitance between an input and the power supply.

According to the example embodiment illustrated in FIG. 3, capacitance circuit 300 comprises a capacitor 302 that is coupled between the input and the Vdd power rail, a capacitor 304 that is coupled between the input and the Vss power rail, and a plurality of trimming capacitance circuits 306. The trimming capacitance circuits are configured, when turned on, to add trimming capacitance to the capacitance circuit. Each trimming capacitance circuit comprises a switch 308 that can be set to add the trimming capacitance to the capacitance circuit, a capacitor 310, that is coupled between the switch and the Vdd power rail, and a capacitor 312 that is coupled between the switch and the Vss power rail.

External test equipment or, alternatively, an internal calibration circuit (or a combination of external and internal circuits) sets, during calibration, a capacitance trimming code (e.g., a three-bit binary number). A Bin-to-Thermometer circuit 314 converts the binary code to a thermometer code, in which the number of set bits is determined according to the code. The thermometer code is used to control switches 308 of the trimming capacitance circuits. For example, responsively to a trimming code equals 4, the binary to thermometer circuit activates four switches of four trimming capacitor circuits, thus adding to the capacitance four capacitors 310 coupled to the Vdd and four capacitors 312 coupled to the Vss.

In some embodiments the capacitance trimming code is permanently programmed, after calibration, in fuses; in other embodiments the code is programmed in non-volatile memory cells, and in yet other embodiments the code is programmed in registers (in which case calibration is required at least upon power-on).

In embodiments, the coupling of capacitors to both supplies further improves supply noise resilience to the high frequency noise, keeping output stage overdrive constant for high frequencies by coupling the output stage input devices gate terminals to both supplies.

Figure 4:
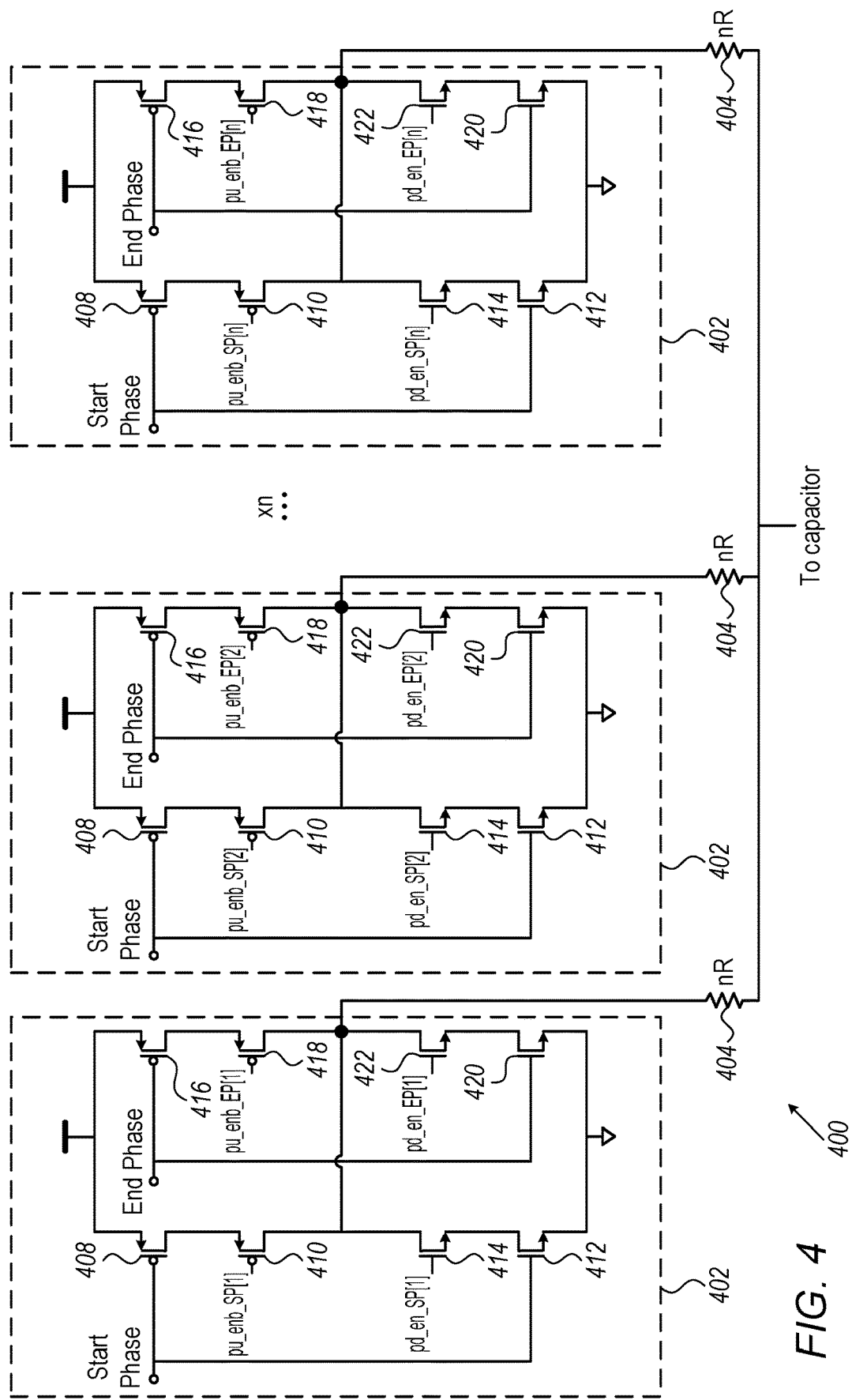
FIG. 4 is a circuit diagram that schematically illustrates a Switched Resistor Network (SRN), in accordance with an embodiment that is described herein.

FIG. 4 is a circuit diagram that schematically illustrates a Switched Resistor Network (SRN) 400, in accordance with an embodiment that is described herein. The SRN comprises n identical switching circuits 402, where n is the number of code bits. Each switching circuit charges or discharges capacitor 102 through a resistor n*R.

Each switching circuit 402 comprise: i) a PMOS transistor 408, for charging capacitor 102 when the start-phase input is low; ii) a PMOS transistor 410 that is set (by control circuit 108) to allow capacitor charging through transistor 408; iii) an NMOS transistor 412, for discharging capacitor 102 when the start-phase input is high; iv) an NMOS transistor 414 that is set (by control circuit 108) capacitor to allow discharge through transistor 412; v) a PMOS transistor 416, for charging capacitor 102 when the end-phase input is low; vi) a PMOS transistor 418 (set by control circuit 108) to allow capacitor charging through transistor 416; vii) an NMOS transistor 420, for discharging capacitor 102 when the end-phase input is high; and, viii) an NMOS transistor 422 that is set (by control circuit 108) to allow capacitor discharge through transistor 420.

Control signals pd_en_SP<i> and pu_enb_SP<i> are, respectively, positive and negative control signals that are set by control circuit 108 (FIG. 1), responsively to the code input. When Start-Phase is on (high or, low, according to the polarity of the input signal edge), some (or all, or none) of switching circuits 402 will charge or discharge capacitor 102 through a respective n*R resistor.

Control signals pd_en_EP<i> and pu_enb_EP<i> are, respectively, positive and negative control signals that are set by control circuit 108 (FIG. 1), complementary to input code. When End-Phase is on (high or, low, according to the polarity of the input signal edge), all switching circuits 402 will charge or discharge capacitor 102 through the respective n*R resistors.

In an embodiment, using resistors also has a side benefit of compensating for temperature drifts, as the overall effect of temperature on effective resistance of MOS devices and resistors is compensated. In some embodiments this effect can be trimmed and tuned by digital controls.

Thus, the charge or discharge rate when Start-Phase is on, is determined responsively to the input code, whereas the charge or discharge rate when End-Phase is on, is independent of the input code.

The configuration of SRN 400, illustrated in FIG. 4 and described hereinabove is cited by way of example. Other configurations may be used in alternative embodiments. For example, in some embodiments different resistors are used in the charge path and in the discharge path of the capacitor, allowing separate control of the rising and falling edges.

Figure 5:
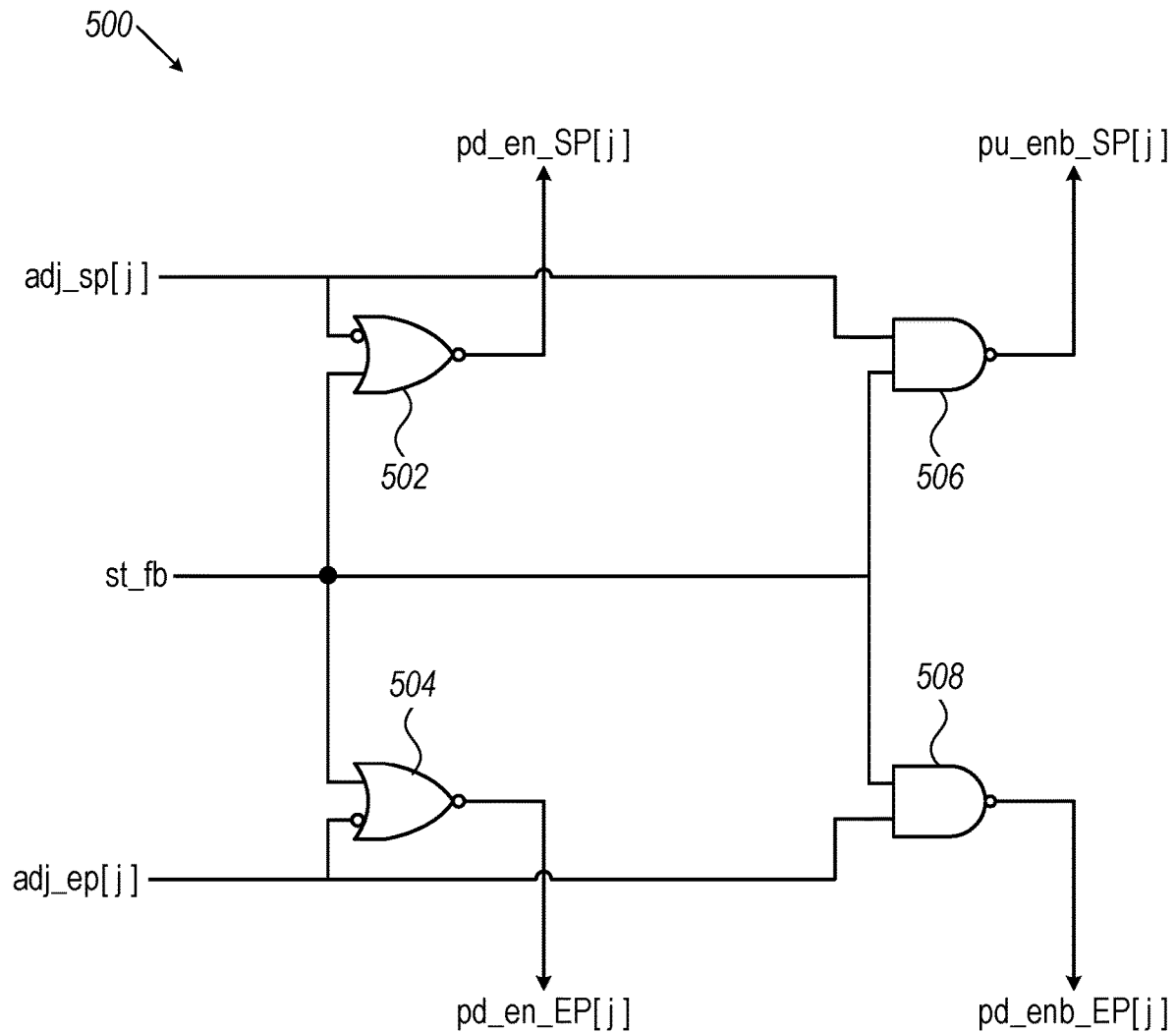
FIG. 5 is a block diagram that schematically illustrates a Unit-Control circuit, in accordance with an embodiment that is described herein.

FIG. 5 is a block diagram that schematically illustrates a Unit-Control circuit 500, in accordance with an embodiment that is described herein. In embodiments, control circuit 108 (FIG. 1) comprises n+1 instances of unit-control-j circuits 500, $0 \leq j \leq n$, where n is the number of bits in the interpolation code. All unit-control circuits 500 receive a common feedback signal from the Schmitt-trigger (st_fb) from Stage-3 Timing Circuit 110 (FIG. 1). The feedback signal indicates whether a charging cycle or a discharging cycle should take place. In embodiments, the st_fb feedback signal is an inverted version of the digital feedback output of stage-3 timing circuit 110 (FIG. 1). The inversion circuit is not shown.

Each unit-control-j circuit 500 receives an adjust-start-phase input (adj_sp [j]) and an adjust-end-phase (adj_ep [j]) input. The adj_sp [j] and the adj_ep [j] signals are generated by a logic thermometer decoder, and hold the interpolation code information, where j is a value between 0 to N.

A NOR gate 502 enables the start-phase pull-down path through transistor 414 (FIG. 4); a NOR gate 504 enables the end-phase pull-down path through transistor 422; a NAND gate 506 enables the start-phase pull-up path through transistor 410; and, a NAND gate 508 enables the end-phase pull-up path through transistor 418. NOR gates 502 and 504 receive a complementary value of adj_sp [j] and adj_ep [j], forming a logic redundancy. However, as NOR gates respond faster to falling edges whereas NAND gates respond faster to rising edges, the logic configuration illustrated in FIG. 5 guarantees non-overlapping logic mode swap. In some embodiments single logic function for both controls may be used, trading flexibility and performance for simpler controller. In other embodiments, control signals pd_en_sp [j], pu_enb_sp [j], pd_en_ep [j] and pu_enb_ep [j] are static, depending on code only, and the phase interpolator relies on SP and EP to perform the logic mode swap (this, however, requires a high-performance phase generator).

Figure 6:
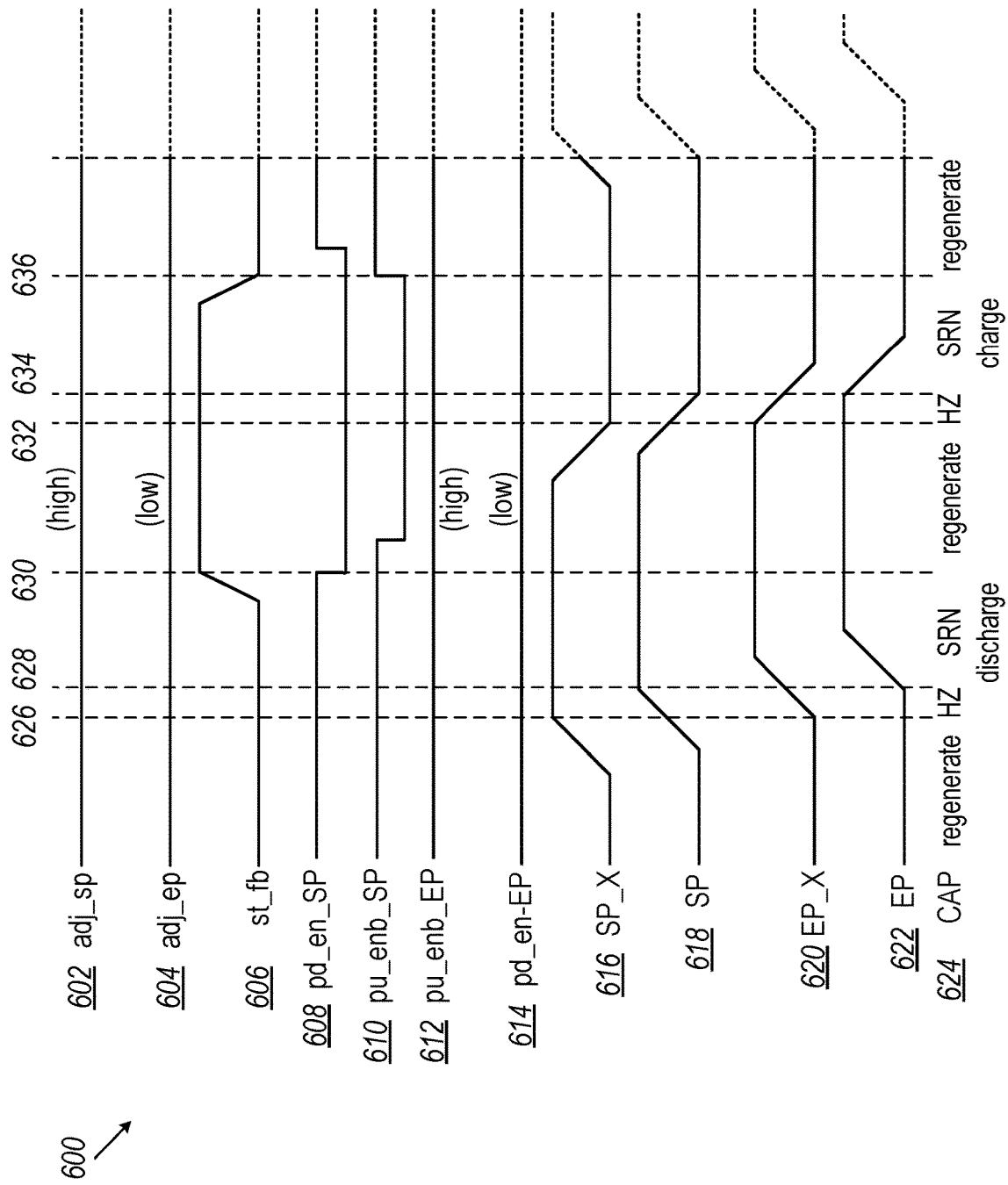
FIG. 6 is a timing diagram that schematically illustrates waveforms of the unit-control circuit, in accordance with an embodiment that is described herein.

FIG. 6 is a timing diagram that schematically illustrates waveforms 600 of the unit-control circuit, in accordance with an embodiment that is described herein.

According to the example embodiment illustrate in FIG. 6, the feed-forward input indication to Stage-3-Timing circuit 110 (FIG. 1) comprises an SP_X signal that slightly leads the Start-Phase SP signal, and an EP_X signal that slightly leads the End-Phase EP signal may be scaled and tunes according to the operating frequency. In an example embodiment, the lead times of the SP_X and EP_X over the respective SP and EP signals are around 10-20 ps.

A graph 602 represents the adj_sp[j] input of the unit-control circuit, a graph 604 represents the adj_ep[j] input, and a graph 606 represents the st_fb input (after inversion) that the unit-control circuit receives from Stage-3 Timing Circuit 110 (FIG. 1).

A graph 608 illustrates pd_en_SP—the output of NOR gate 502 (FIG. 5), a graph 610 illustrates pu_enb_SP—the output of NOR gate 504, a graph 612 illustrates pu_enb_EP—the output of NAND gate 506 and a graph 614 illustrates pd_en_EP—the output of NAND gate 508.

It should be noted that graphs 602, 604, 606, 608, 610, 612 and 614 are simplified for the sake of conceptual clarity. In practice, the curves do not comprise straight lines, and the gates do not change state at zero time.

A graph 616 illustrates the SP_X feed-forward signal, which leads SP (illustrated by a graph 618), and a graph 620 illustrated the EP_X feed-forward signal, which leads EP (illustrated by a graph 622). Feedforward signal SP_X enables (when at logic low) the charging of the capacitor circuit 102 whereas signal EP_X enables (when at logic high) the discharging of the capacitor (SP_X and EP_X will be described below, with reference to FIG. 7).

Lastly, a graph 624 indicates a charge, discharge, regenerate or not-connected ("HZ", or Hi-Z) state of capacitor 102.

The capacitor can be charged or discharged through the SRN or by regeneration (through timing circuit). Some overlap may occur, but the dominant current will be the boost current. In some embodiments the delay from st_fb to the control circuit can be tuned such that the overlap is better controlled. Once st_fb signal reaches control circuit and logic function has settled, the timing circuit will solely charge the capacitor, or hold the logic value once the signal has been regenerated. This state will remain until the feedforward signal is reached and the boost current disconnected. During this time, the SRN control has already switched mode, to interpolate the upcoming transition (which is opposite from previous).

Initially, the phase interpolator input is static and the voltage is driven high (by Stage-3 Timing Circuit 110, FIG. 1). At a Time-Point 626 the feedforward signal SP_X 616 reaches a high voltage, causing Timing Circuit 110 to stop driving the capacitor voltage. The capacitor is disconnected from any charge or discharge path (the capacitor is in a High-Z ("HZ" state).

At a Time-Point 628-SP signal 618 reaches a high voltage; the SRN starts to discharge the capacitor (stage-1 and stage-2); the EP signal reaches high voltage shortly afterwards.

At a timepoint 630—Timing Circuit 110, responsively to a voltage level on the capacitor, starts regenerating the capacitor voltage (driving the voltage towards the low supply rail.

At a Time Point 632—the feedforward signal SP_X 616 reaches a low voltage level, causing Timing Circuit 110, again, to enter a HZ state, wherein the capacitor is not driven. At a Time Point 634 SP signal 618 reaches a low voltage level and the SRN starts to charge the capacitor.

Lastly, at a Time Point 636 the timing circuit, responsively to a voltage level on the capacitor, starts regenerating the capacitor voltage (driving the voltage towards the high supply rail.

after 636 Time Point 636 the phase interpolator is, again, at the initial conditions (prior to Time Point 626).

The configuration of unit-control circuit 500 and the respective timing diagram 600, illustrated in FIGS. 5, 6 and described above is an example configuration that is cited by way of example. Other configurations and respective timing diagrams may be used in alternative embodiments. For example, in some embodiments, some or all the unit-control logic circuits may be implemented in the switching network 400, using additional switching transistors in the charge and discharge paths.

FIG. 7 is a block diagram that schematically illustrates a Stage-3 Timing Circuit 700, in accordance with an embodiment that is described herein. The Stage-3 Timing Circuit detects the start of charging/discharging stage 3, provides boost charge or discharge to capacitor 102 (FIG. 1) at stage 3, and provides digital feedback to control circuit 108.

The Stage-3 Timing Circuit comprises a Schmitt-trigger circuit 702, which is configured to monitor the voltage level on capacitor 102 and indicate when the voltage is above a first level during a transition from low to high, or below a second level (that is lower than the first level) during a transition from high to low. In embodiments, both the hysteresis (the difference between the two levels) and the Schmitt-trigger threshold (the average between the two levels) can be calibrated during manufacturing and/or periodically.

Two inverters invert the two feed-forward timing input signals—an inverter 712 inverts an SP_x timing signal, and an inverter 714 inverts an EP_x timing signal. In an embodiment, both SP_x and EP_x timing signals are generated by reference-signal generator 101 (FIG. 1); SP_x precedes the Start-Phase signal and EP_x precedes the End-Phase signal; the feedforward is used to disconnect the extra charge/discharge before future transitions.

The boost charge of the capacitor is provided by a PMOS transistor 704, whereas the boost discharge is provided by an NMOS transistor 706. A NAND gate 708 allows boost charge when the Schmitt trigger indicates that the capacitor is above the high level, and the two inverters 712, 714 output logic-high (that is-both input SP_x and EP_x are at logic low). In a similar manner, a NOR gate 710 allows boost discharge when the Schmitt trigger indicates that the capacitor is below the low level, and the two inverters output logic-low (that is-both input SP_x and EP_x are at logic high).

According to the example embodiment illustrated in FIG. 7, the phase interpolator compensates and mitigates the drawbacks of the resistors in the circuit. To achieve high supply noise rejection and good linearity, the RC time constant of the SRN must be large, which significantly limits the bandwidth. The regeneration of the signal at the proper threshold, however, overcomes this inherent limitation, achieving good power supply induced jitter reduction and at high rates, significantly better than traditional SRNs, and improving the mismatch performance by using large resistors. In addition, the disconnection of the charge/discharge path when preparing for a next discharge/charge cycle (respectively) through the SRN allows supporting poor input slopes, further improving accuracy and linearity even when the phase generator has poor performance.

The configuration of stage-3 timing circuit 700 illustrated in FIG. 7 and described hereinabove is an example that is cited for the sake of conceptual clarity. Other configurations may be used in alternative embodiments. For example, in embodiments, Schmitt trigger 702 comprises calibration means for the low and the high levels rather than the hysteresis and the mean threshold; in an embodiment, transistors 704, 706 may be replaced by a tristate buffer, with suitable enable and input logic circuitry.

FIG. 8A is a block diagram that schematically illustrates a Reference Phase Generator 800 (101, FIG. 1), in accordance with a first example embodiment that is disclosed herein. The reference phase generator comprises a delay chain 802, also referred to as a shift register, that is configured to generate delayed versions of the input signal. Delay chain 802 comprises a plurality of delay stages 804. In an embodiment, each delay stage 804 is an inverter; in other embodiments each delay stage may comprise a non-inverting buffer (e.g., two serially connected inverters), and in yet other embodiments each delay stage may comprise a combination of active (e.g., inverters) and passive (e.g., RC pairs) delay elements.

Reference Phase Generator 800 further comprises a k-to-2 multiplexer 806 where k is the number of the stages which is configured to select, in the delay chain, according to a preset select code, a first and a second outputs of the delay-chain. The first selected output, (the one closer to the input signal end of the delay chain) is the SP_X feed-forward output of the reference phase generator, whereas the second selected output is the EP_x feed-forward output. A resistor 808, coupled to a capacitor 810 delays SP_x, to form the SP output, and a resistor 812, coupled to a capacitor 814 delays EP_x, to form the EP output. Thus, SP_x slightly precedes SP, and EP_x slightly precedes EP.

FIG. 8B is a block diagram that schematically illustrates a Reference Phase Generator 850 (101, FIG. 1), in accordance with a second example embodiment that is disclosed herein. Reference Phase Generator 850 further comprises a k-to-4 multiplexer 852, which is configured to select, according to a preset select code, a first, a second, a third and, a fourth outputs of the delay-chain. Typically, the first and the second outputs are connected to adjacent outputs of the delay chain, e.g., one delay-unit apart. The first output is, then, the SP_x output of the reference phase generator, whereas the second output is the SP. Similarly, the third and fourth outputs are typically connected to adjacent outputs of the delay chain, and form, respectively, the EP_x and signal EP outputs. In and SP are typically topology 8B, the signals SP_x complementary to each other, obviating the need for inverter 712, and providing more control on delay between SP_x and SP, allowing optimization of power, performance and area. The same applies to EP_x, EP and inverter 714 respectively.

The configurations of the Reference Phase Generators illustrated in FIGS. 8A, 8B and described above are example configurations that are cited merely for the sake of conceptual clarity. Other embodiments may be used in alternative embodiments. For example, in an embodiment, a configuration similar to configuration 800 is used, with non-inverting buffers replacing the RC delays.

Single Slope Interpolation Mode

The configurations described above may be used for data (Non-Return-to-Zero, or NRE) or clock (RZ) inputs.

However, for clock inputs that constantly toggle, the configuration of the phase interpolation may be slightly different, allowing operation in higher frequencies (since inter-symbol interference (ISI) is not an issue like it is in data paths). In embodiments, when the phase interpolation is used for signals, the frequency is doubled and a single edge only is used for data sampling. Thus, duty-cycle distortion and ISI can be mitigated.

To efficiently handle clock inputs, The various subunits of the phase interpolator described above are slightly modified:

1. A Reset stage is added, in which the capacitor is charged (or discharged) at high speed, regardless of the code.
2. Control Circuit 108 (FIG. 1) is modified for non-symmetric operation in rising and falling edges.
3. Stage-3 Timing Circuit 110 (FIG. 1) is modified to fully complete the charge/discharge at the reset stage.
4. In some embodiment, the phase interpolator comprises a replica interpolator that does not include resistors, and is used to boost the reset stage.

Figure 9:
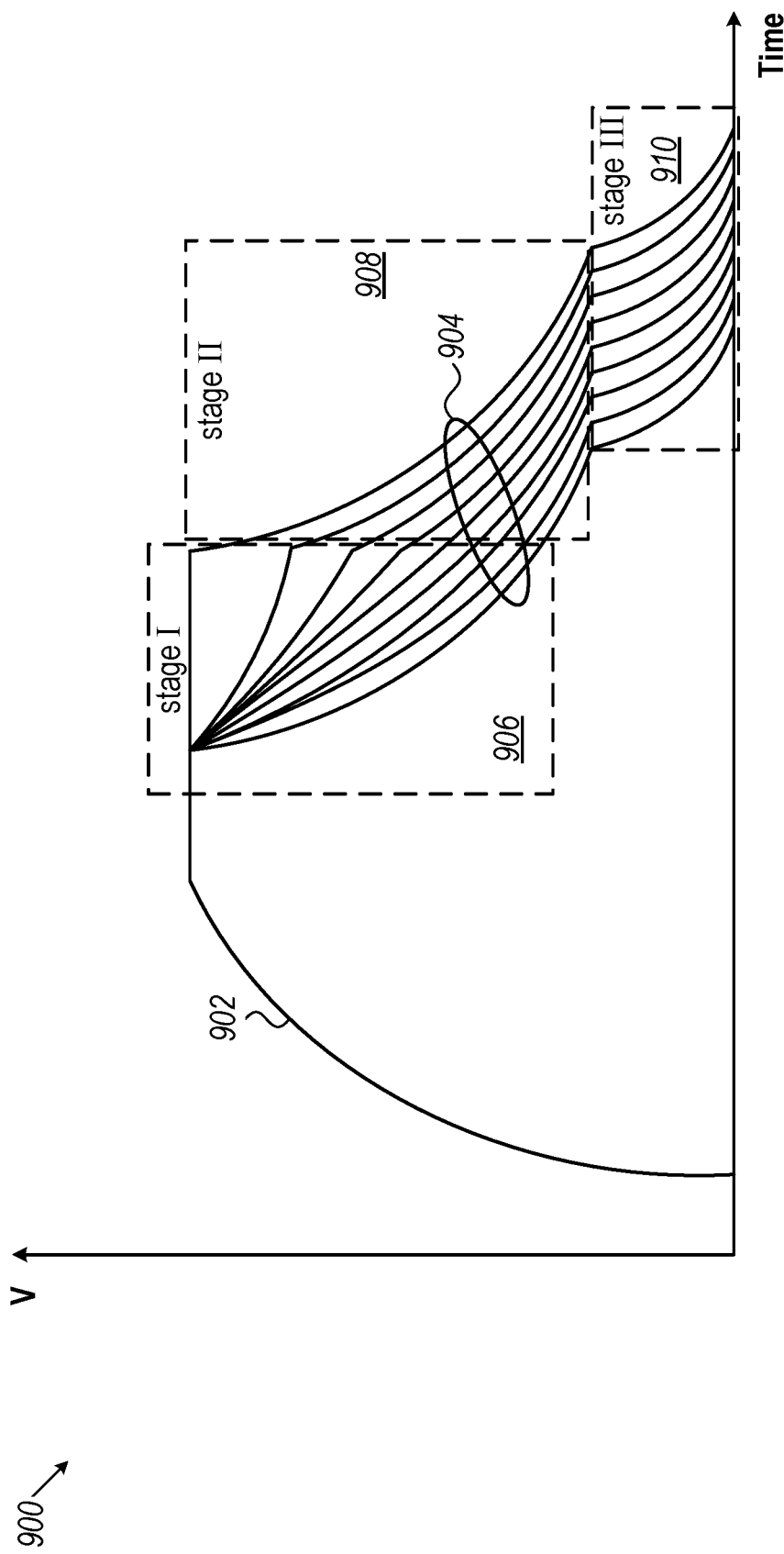
FIG. 9 is a timing diagram that schematically illustrates waveforms of a capacitor voltage in a single-slope phase interpolator, in accordance with an embodiment that is described herein.

FIG. 9 is a timing diagram 900 that schematically illustrates the waveforms of the capacitor voltage, in a Single-Slope Phase Interpolator, in accordance with an embodiment that is described herein. The rising edge of the capacitor waveform 902 is independent of the N code; for example, the phase delay during the rising edge can be minimal. (This is the "reset" stage, where the capacitor resets to one of power supply rails (Vdd for rising edge and Vss for falling edge) The reset speed can be tuned according to the input frequency).

During the falling edge, the waveform splits to multiple curves 904, according to the code. In a code-dependent first stage 906, the falling edge of the waveforms is code-dependent. Then, at a code-independent second stage 908, the capacitor discharge rate is constant, and, consequently, curves 904 are parallel. Lastly, at stage-3 910, the boost current discharges the capacitor at the fastest possible rate, to be ready for the next rising edge.

Duty Cycle Correction

The correction of a single edge only (or, in embodiments, the independent corrections of the rising edge and the falling edge) is used, in embodiments, to correct the duty cycle of signals (e.g., clock). In some embodiments, duty cycle may be measured in run-time, and any deviation from a desired duty cycle (e.g., 50%) is fed back to change the code input of the Phase Interpolator and correct the duty cycle.

Figure 10:
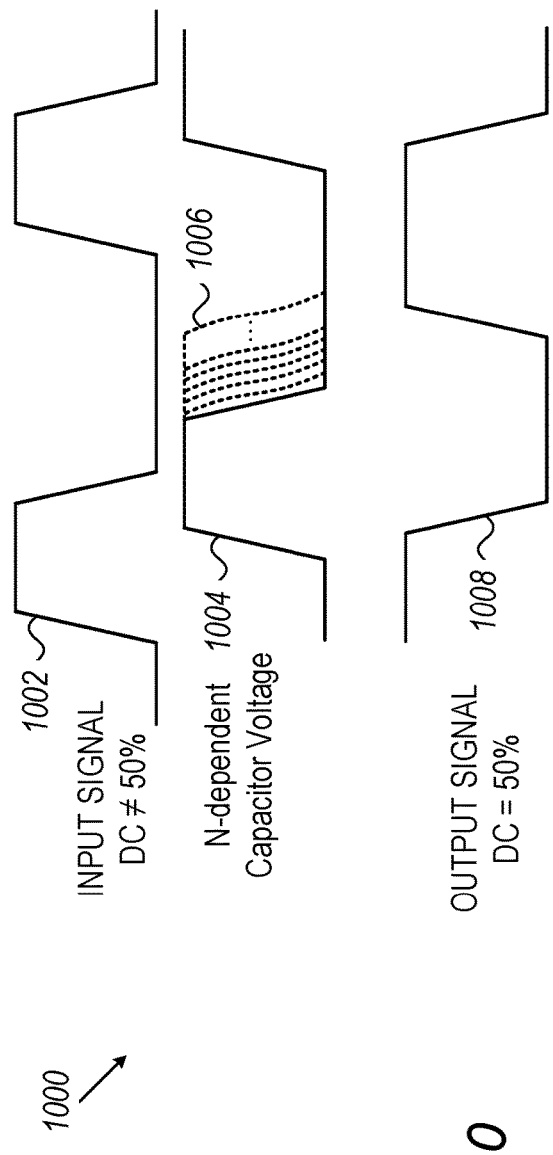
FIG. 10 is a timing diagram that schematically illustrates duty cycle correction waveforms, in accordance with an embodiment that is disclosed herein.

FIG. 10 is a timing diagram 1000 that schematically illustrates the duty cycle correction waveforms, in accordance with an embodiment that is disclosed herein. An input signal 1010, with duty cycle of less than 50% is input to a Phase Interpolator 100. The Phase Interpolator is modified to allow separate rising and falling edge delays. A graph 1004 represents the ensuing capacitor voltage; during the rising edge of input signal 1002, the capacitor voltage follows curve 1002 with a delay that is independent of the code. During the falling edge of the input signal, however, the discharge rate of the capacitor follows one of curves 1006, according to the N code.

When a suitable code is selected, the output signal of the Phase Interpolator (generated by inverter 114, FIG. 1) has a duty cycle of 50%. KKD NOTE: No mention of 1008

Cascaded Phase Interpolation

In some embodiments, a cascaded group of phase interpolators is used to produce a high-resolution interpolated output signal. In an embodiment, two low resolution phase interpolators are configured to produce a start-phase and a stop-phase of a high-resolution final phase interpolators. For example, to achieve a 1-degree phase resolution in the range between 30 to 35 degrees, a first phase interpolator with a 10-degree resolution may be configured to generate a signal at 30 degrees, and a second 10-degree resolution phase interpolator may be configured to generate a signal at 40 degrees. The two signals are then input to the start-phase and end-phase inputs of a 1-degree resolution phase interpolator.

Figure 11:
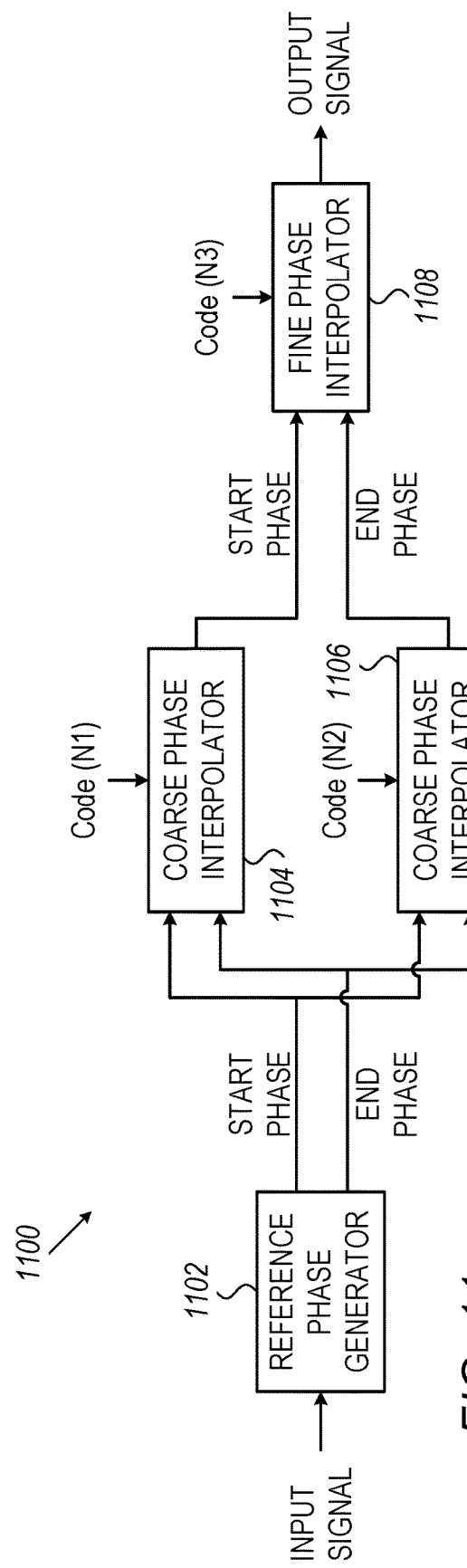
FIG. 11 is a block diagram that schematically illustrates a Cascaded Phase Interpolator, in accordance with an embodiment that is described herein.

FIG. 11 is a block diagram that schematically illustrates a Cascaded Phase Interpolator 1100, in accordance with an embodiment that is described herein. Cascaded Phase Interpolator 1100 comprises a Reference Phase Generator 1102 (e.g., Phase Reference Generator 101, FIG. 1), which is configured to generate a start-phase signal and an end-phase signal, The start-phase and end-phase signals are input to a Coarse Phase Interpolator 1104, with code=N1, and a Coarse Phase Interpolator 1106, with code=N2. Coarse Phase-Interpolators 1104 and 1106 are like Phase Interpolator 100, except that the coarse phase interpolators do not comprise Reference Phase Generators (instead, the Coarse Phase Interpolators share the Reference Phase Generator 1102). The output signals of Coarse Phase-Interpolators 1104 and 1106 are, respectively, the start-phase and end-phase of a Fine-Resolution Phase interpolator 1108, with code=N3, which outputs a high-resolution high dynamic range phase-interpolated signal.

Figure 12:
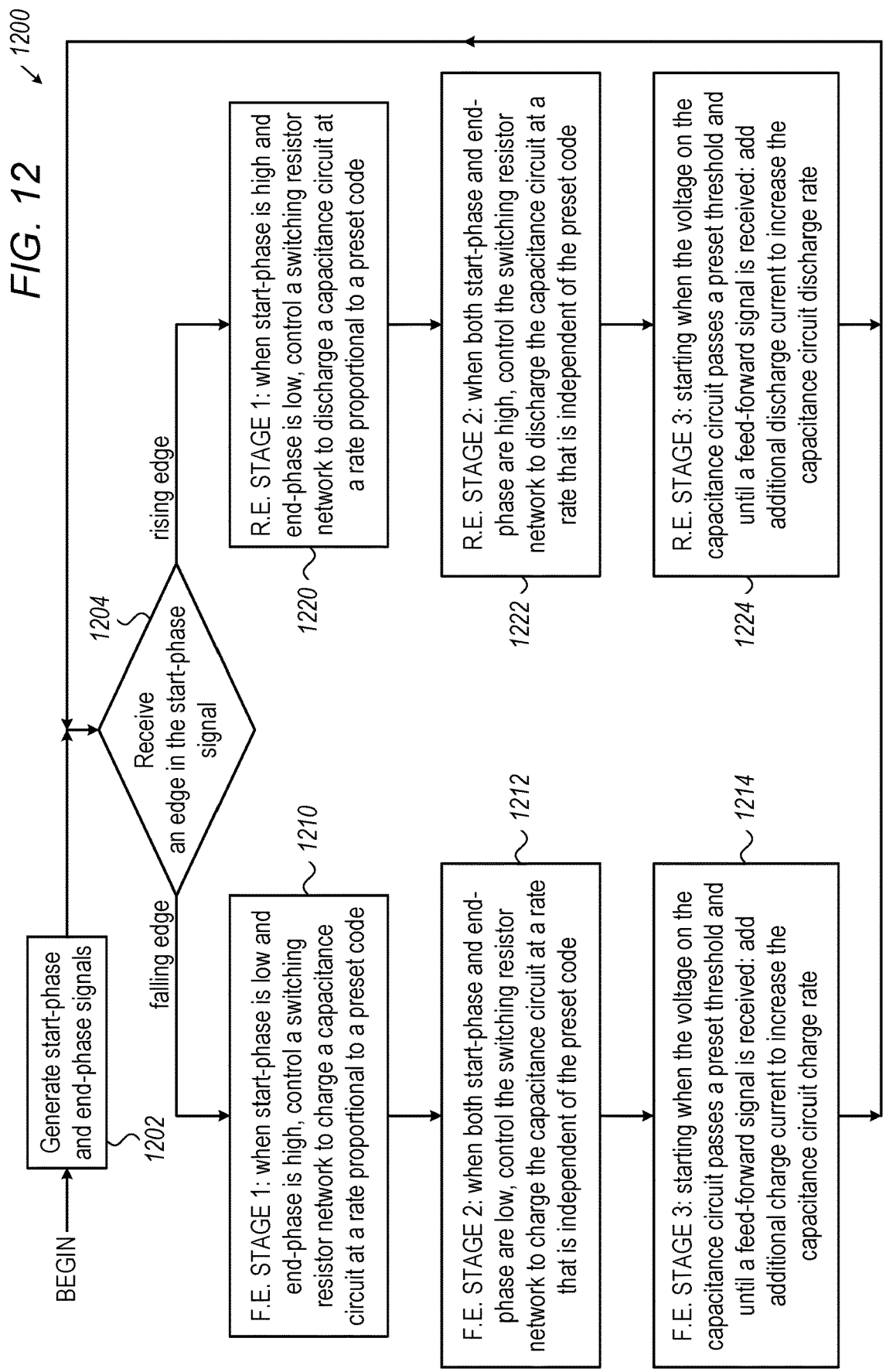
FIG. 12 is a flowchart 1200 that schematically illustrates a method for generating an interpolated phase output signal, in accordance with an embodiment that is described herein.

FIG. 12 is a flowchart 1200 that schematically illustrates a method for generating an interpolated phase output signal, in accordance with an embodiment that is described herein. The flowchart is executed by the various subunits of Phase Interpolator 100 (FIG. 1), which are described hereinabove.

The flowchart starts at a Generate-Start-And-End-Phase-Signals operation 1202, wherein Reference Phase Generator 101 (FIG. 1) generates, responsively to an input signal, a start-phase signal, and an end-phase signal. Both generated signals are delayed versions of the input signal, where the delay of the start-phase signal is lower than the delay of the end-phase signal. The relative phase of the output signal that the phase interpolator generates is an interpolation between the phases of the start-phase signal and the end-phase signal, according to a code input.

Next, at a Receive-Start-Phase operation 1204, the phase interpolator waits for the next edge in the start-phase signal. Responsively to a falling edge, the flowchart will enter a Falling-Edge-Stage-1 operation 1210, wherein, responsively to a low level of the start-phase signal concurrently with a high level of the end-phase signal, an SRN charges an integration capacitance at a rate that is determined according to an input code.

The phase interpolator will then enter a Falling-Edge-Stage-2 operation 1212, wherein, responsively to a low level of both the start-phase and the end-phase signals, the SRN charges the integration capacitance at a rate that is independent of the input code.

Next, the flowchart enters a Falling-Edge-Stage-3 operation 1214, wherein the phase interpolator, responsively to a voltage level of the integration capacitor, boosts the charge current to rapidly complete the capacitor charging. After operation 1214 the flowchart reenters to operation 1204, where the system is idle until the next rising edge in start signal arrives.

The operations that take place following a rising edge of the start-phase signal are similar, except that the capacitor is discharged rather than charged.

If, in Receive-Start-Phase operation 1204, the next edge of the start-phase signal is a rising edge, the flowchart will enter a Rising-Edge-Stage-1 operation 1220 wherein, responsively to a high level of the start-phase signal concurrently with a low level of the end-phase signal, the SRN discharges the integration capacitance at an input-code dependent rate.

Next, at a Rising-Edge-Stage-2 operation 1222, the SRN, responsively to a high level of both the start-phase and the end-phase signals, discharges the integration capacitance at a rate that is independent of the input code.

Lastly, the flowchart enters a Rising-Edge-Stage-3 operation 1224, wherein the Phase Interpolator, responsively to a voltage level of the integration capacitor, boosts the discharge current, to rapidly complete the capacitor discharge. After operation 1224 the flowchart reenters to operation 1204, where the system is idle until the next falling edge in start signal arrives.

It should be noted that, to complete the phase interpolation with non-inverting logic, an inverting buffer should invert the voltage on the integration capacitor.

The configuration of flowchart 1200 illustrated in FIG. 12 and described hereinabove is cited by way of example. Other flowchart configurations may be used in alternative embodiments. For example, in some embodiments stage 3 is not used. In other embodiments, stage 3 ends responsively to a feed-forward signal (as described above, with reference to FIG. 1).

The configuration of Phase Interpolator 100, including Reference Phase Generators 800 and 850, Switched Resistor Network (SRN) 400, Control Circuit 500, Stage-3 Timing Circuit 700, Capacitance Circuit 300, Cascaded Phase Interpolator 1100, including all subunits thereof; waveforms 200, 600, 900 and 1000, and the method of flowchart 1200, illustrated in FIGS. 1 through 12 and described hereinabove are example configurations, waveforms and flowcharts that are shown purely for the sake of conceptual clarity. Any other suitable configurations, waveforms and flowchart can be used in alternative embodiments.

In various embodiments, Phase Interpolators 100 and 1100 or subunits thereof may be implemented using suitable hardware, such as one or more Application-Specific Integrated Circuits (ASIC) or Field-Programmable Gate Arrays (FPGA), or a combination of ASIC and FPGA.

Figure 13:
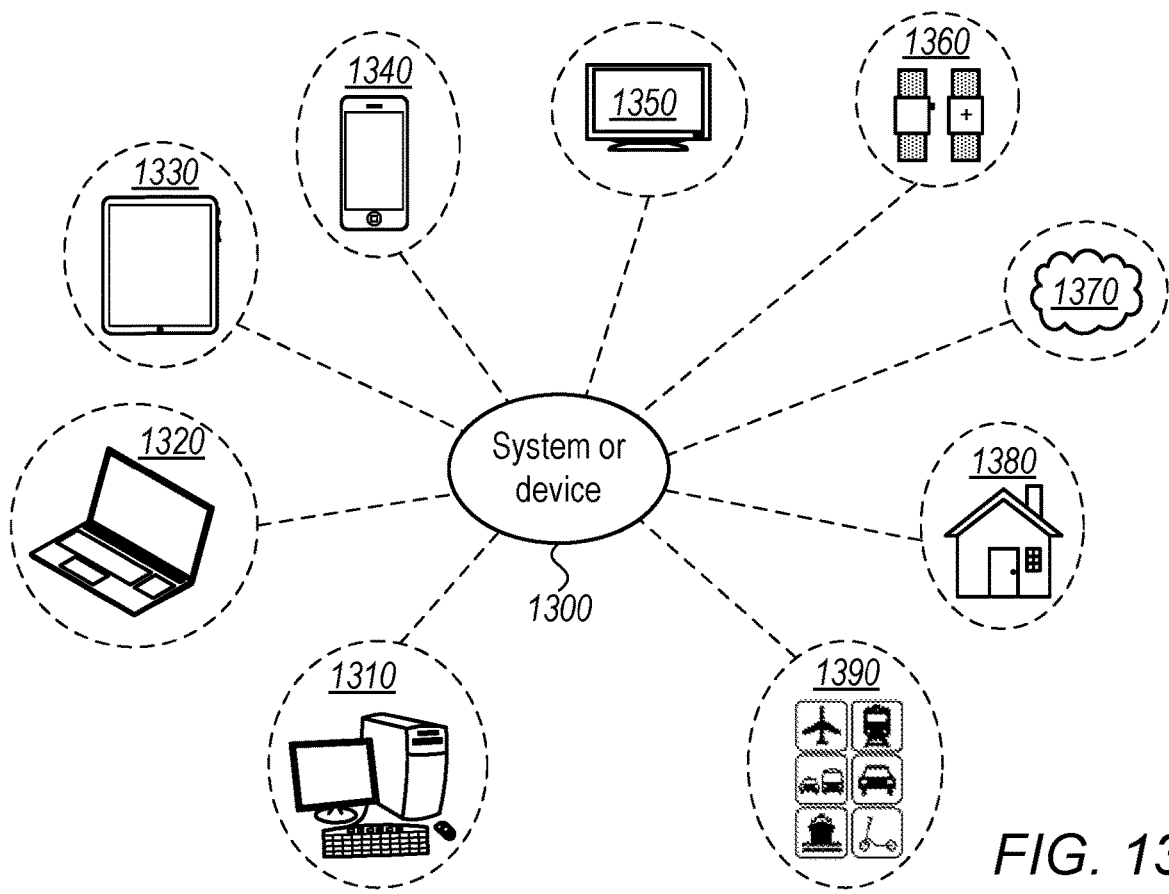
FIG. 13 is a diagram that schematically illustrates various types of systems that may include any of the circuits, devices, or system discussed above, in accordance with embodiments that are described herein.

FIG. 13 is a diagram 1300 that schematically illustrates various types of systems that may include any of the circuits, devices, or system discussed above, in accordance with embodiments that are described herein. System or device 1300, which may incorporate or otherwise utilize one or more of the techniques described herein, may be utilized in a wide range of areas. For example, system or device 1300 may be utilized as part of the hardware of systems such as a desktop computer 1310, laptop computer 1320, tablet computer 1330, cellular or mobile phone 1340, or television 1350 set-top box coupled to a television).

Similarly, disclosed elements may be utilized in a wearable device 1360, such as a smartwatch or a health-monitoring device. Smartwatches, in many embodiments, may implement a variety of different functions, for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1300 may also be used in various other contexts. For example, system or device 1300 may be utilized in the context of a server computer system, such as a dedicated server or on shared hardware that implements a cloud-based service 1370. Still further, system or device 1300 may be implemented in a wide range of specialized everyday devices, including devices 1380 commonly found in the home such as refrigerators, thermostats, security cameras, etc. The interconnection of such devices is often referred to as the "Internet of Things" (IoT). Elements may also be implemented in various modes of transportation. For example, system or device 1300 could be employed in the control systems, guidance systems, entertainment systems, etc. of various types of vehicles 1390.

The applications illustrated in FIG. 13 are merely exemplary and are not intended to limit the potential future applications of disclosed systems or devices. Other example applications include, without limitation: portable gaming devices, music players, data storage devices, unmanned aerial vehicles, etc.

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

Figure 14:
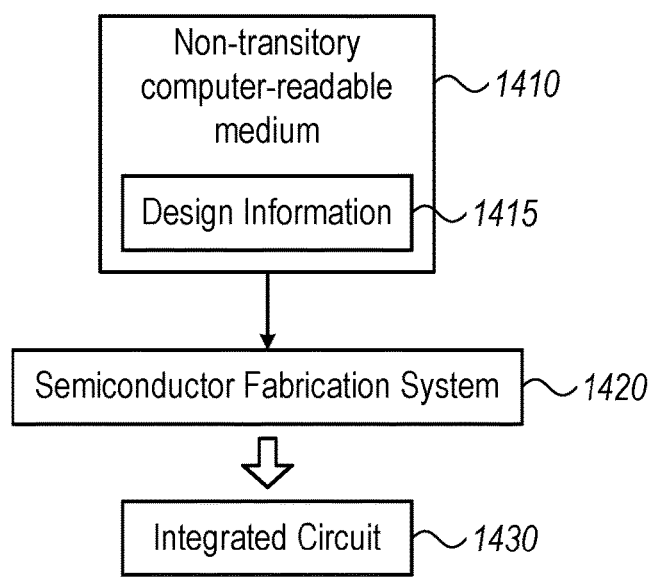
FIG. 14 is a block diagram illustrating an example non-transitory computer-readable storage medium that stores circuit design information, according to some embodiments.

FIG. 14 is a block diagram illustrating an example non-transitory computer-readable storage medium that stores circuit design information, according to some embodiments. In the illustrated embodiment semiconductor fabrication system 1420 is configured to process the design information 1415 stored on non-transitory computer-readable medium 1410 and fabricate integrated circuit 1430 based on the design information 1415.

Non-transitory computer-readable storage medium 1410, may include any of various appropriate types of memory devices or storage devices. Non-transitory computer-readable storage medium 1410 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1410 may include other types of non-transitory memory as well or combinations thereof. Non-transitory computer-readable storage medium 1410 may include two or more memory mediums which may reside in different locations, e.g., in different computer systems that are connected over a network.

Design information 1415 may be specified using any of various appropriate computer languages, including hardware description languages such as, without limitation: VHDL, Verilog, SystemC, SystemVerilog, RHDL, M, MyHDL, etc. Design information 1415 may be usable by semiconductor fabrication system 1420 to fabricate at least a portion of integrated circuit 1430. The format of design information 915 may be recognized by at least one semiconductor fabrication system 1420. In some embodiments, design information 1415 may also include one or more cell libraries which specify the synthesis, layout, or both of integrated circuit 1430. In some embodiments, the design information is specified in whole or in part in the form of a netlist that specifies cell library elements and their connectivity. Design information 1415, taken alone, may or may not include sufficient information for fabrication of a corresponding integrated circuit. For example, design information 1415 may specify the circuit elements to be fabricated but not their physical layout. In this case, design information 1415 may need to be combined with layout information to actually fabricate the specified circuitry.

Integrated circuit 1430 may, in various embodiments, include one or more custom macrocells, such as memories, analog or mixed-signal circuits, and the like. In such cases, design information 1415 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1420 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1420 may also be configured to perform various testing of fabricated circuits for correct operation.

In various embodiments, integrated circuit 1430 is configured to operate according to a circuit design specified by design information 1415, which may include performing any of the functionality described herein. For example, integrated circuit 1430 may include any of various elements shown in FIGS. 1 through 11. Further, integrated circuit 1430 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that arise from the disclosed embodiments. Not all may implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation-[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112 (f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

The invention claimed is:

1. A phase interpolator circuit, comprising:
   a capacitance circuit;

a switched resistor network, which has a configurable resistance and is configured to:
- receive a start-phase reference signal;
- receive an end-phase reference signal that is delayed relative to the start-phase reference signal; and
- generate an interpolated output signal corresponding to a voltage on the capacitance circuit; and interpolation management circuitry, configured to:
- receive an interpolation code that defines an intermediate phase between the start-phase reference signal and the end-phase reference signal;
- charge or discharge the capacitance circuit through the switched resistor network; and
- control the switched resistor network to set a phase of the interpolated output signal to match the intermediate phase defined by the interpolation code, wherein the interpolation management circuitry is further configured to:
(i) responsively to a transition in the start-phase reference signal, set the resistance of the switched resistor network based on the interpolation code; and
(ii) responsively to a voltage level on the capacitance circuit, set the resistance of the switched resistor network to a constant resistance that is independent of the interpolation code, and flow through the capacitance circuit an additional boosting current that accelerates charging or discharging of the capacitance circuit.

2. The phase interpolator circuit according to claim 1, wherein the interpolation management circuitry is further configured to, responsively to a transition in the end-phase reference signal, set the resistance of the switched resistor network to a fixed resistance that is independent of the interpolation code, without flowing the additional boosting current.

3. The phase interpolator circuit according to claim 1, wherein the interpolation management circuitry is further configured to suspend or decrease the additional boosting current responsively to a feed-forward indication.

4. The phase interpolator circuit according to claim 3, further comprising a feed-forward generation circuit that is configured to output the feed-forward indication at a preset delay preceding one or both of the start-phase reference signal and the end-phase reference signal.

5. The phase interpolator circuit according to claim 1, wherein the switched resistor network comprises passive resistors.

6. The phase interpolator circuit according to claim 1, wherein the capacitance circuit comprises at least a first capacitor that is coupled to a positive power rail and at least a second capacitor that is coupled to a negative power rail.

7. The phase interpolator circuit according to claim 1, wherein, in response to an edge of the start-phase reference signal, the interpolation management circuitry is configured to set the resistance of the switched resistor network to N*R, where R is a unit resistance and N is an integer derived from the interpolation code.

8. The phase interpolator circuit according to claim 1, wherein the switched resistor network further comprises two or more transistors connected in series to one another, and wherein the interpolation management circuitry is configured to charge or discharge the capacitance circuit through both the transistors and resistors of the switched resistor network.

9. The phase interpolator circuit according to claim 1, wherein the interpolation management circuitry is configured to generate a feedback signal responsively to the voltage on the capacitance circuit, and to charge or discharge the capacitance circuit responsively to the feedback signal.

10. The phase interpolator circuit according to claim 1, wherein the interpolation management circuitry is configured to connect a pull-up device to the capacitance circuit after completing charging of the capacitance circuit, and to connect a pull-down device to the capacitance circuit after completing discharging of the capacitance circuit.

11. The phase interpolator circuit according to claim 1, wherein the start-phase reference signal and the end-phase reference signals are interchangeable.

12. The phase interpolator circuit according to claim 1, further comprising a reference phase generator configured to generate the start-phase reference signal and the end-phase reference signal in response to an input signal.

13. The phase interpolator circuit according to claim 12, wherein the reference phase generator comprises a delay chain configured to generate multiple delayed versions of an input clock, and wherein the reference phase generator is further configured to generate one or more of (i) the start-phase reference signal, (ii) the end-phase reference signal, and (iii) a feed-forward signal, responsively to respective selected outputs of the delay chain.

14. The phase interpolator circuit according to claim 1, wherein the interpolation management circuitry is configured to set the interpolated output signal to have the intermediate phase defined by the interpolation code for a first polarity of an edge of the start-phase reference signal, and to set the interpolated output signal to have a constant phase for a second polarity of the edge of the start-phase reference signal.

15. The phase interpolator circuit according to claim 1, wherein the interpolation management circuitry is configured to set a duty cycle of the interpolated output signal to a preset value.

16. A method for phase interpolation, comprising:
- receiving a start-phase reference signal and an end-phase reference signal that is delayed relative to the start-phase reference signal;
- receiving an interpolation code that defines an intermediate between the start-phase reference signal and the end-phase reference signal;
- charging or discharging a capacitance circuit through a switched resistor network having a configurable resistance; and
- generating, from a voltage on the capacitance circuit, an interpolated output signal having the intermediate phase defined by the interpolation code, wherein the method further comprises:
(i) responsively to a transition in the start-phase reference signal, setting the resistance of the switched resistor network based on the interpolation code; and,
(ii) responsively to a voltage level on the capacitance circuit, setting the resistance of the switched resistor network to a constant resistance that is independent of the interpolation code, and flowing through the capacitance circuit an additional boosting current that accelerates charging or discharging of the capacitance circuit.

17. The method according to claim 16, further comprising, responsively to a transition in the end-phase reference signal, setting the resistance of the switched resistor network to a fixed resistance that is independent of the interpolation code, without flowing the additional boosting current.

18. The method according to claim 16, further comprising suspending or decreasing the additional boosting current responsively to a feed-forward signal.

19. The method according to claim 16, wherein setting the resistance comprises, in response to an edge of the start-phase reference signal, setting the resistance of the switched resistor network to N*R, where R is a unit resistance and N is an integer derived from the interpolation code.

20. The method according to claim 16, further comprising generating the start-phase reference signal and the end-phase reference signal in response to an input signal.

* * * * *